(12) United States Patent  (10) Patent No.: US 7,498,249 B2
Miyazaki et al.  (45) Date of Patent: Mar. 3, 2009

(54) METHOD OF FORMING A CONNECTING CONDUCTOR AND WIRINGS OF A SEMICONDUCTOR CHIP

(75) Inventors: Shinichi Miyazaki, Kanagawa (JP); Hirokazu Honda, Kanagawa (JP); Kenji Ooyachi, Kanagawa (JP)

(73) Assignee: NEC Electronics Corp. (JP)

( * ) Notice: Subject to any disclaimer, the term of this patent is extended or adjusted under 35 U.S.C. 154(b) by 147 days.

(21) Appl. No.: 11/521,354

(22) Filed: Sep. 15, 2006

(65) Prior Publication Data

US 2007/0020907 A1 Jan. 25, 2007

Related U.S. Application Data

(62) Division of application No. 10/771,451, filed on Feb. 5, 2004, now abandoned.

(30) Foreign Application Priority Data

Feb. 6, 2003 (JP) .............................. 2003-30119

(51) Int. Cl.
*H01L 21/44* (2006.01)
(52) U.S. Cl. ............ 438/597; 257/E23.02; 257/E23.021
(58) Field of Classification Search ................. 438/597, 438/615, 612, 613, 585, 108; 257/E23.003, 257/E23.02, E23.021
See application file for complete search history.

(56) References Cited

U.S. PATENT DOCUMENTS

| 5,111,278 | A | | 5/1992 | Eichelberger et al. |
|---|---|---|---|---|
| 5,219,787 | A | * | 6/1993 | Carey et al. .................. 438/637 |
| 5,998,293 | A | | 12/1999 | Dawson et al. |
| 6,037,244 | A | | 3/2000 | Gardner et al. |
| 6,096,655 | A | * | 8/2000 | Lee et al. ..................... 438/700 |
| 6,309,957 | B1 | | 10/2001 | Tu et al. |
| 6,518,165 | B1 | | 2/2003 | Yoon et al. |
| 6,642,139 | B1 | | 11/2003 | Chung et al. |
| 2002/0164544 | A1 | | 11/2002 | Luckanc et al. |
| 2003/0186536 | A1 | | 10/2003 | Brenner |
| 2003/0186558 | A1 | | 10/2003 | Brenner |
| 2005/0020046 | A1 | | 1/2005 | Brenner |

FOREIGN PATENT DOCUMENTS

| JP | 11-233678 | 8/1999 |
|---|---|---|
| JP | 2000-195862 | 7/2000 |
| JP | 2001-15650 | 1/2001 |
| JP | 2001-291721 | 10/2001 |
| JP | 2001-339011 | 12/2001 |
| JP | 2002-93942 | 3/2002 |
| JP | 2002-313993 | 10/2002 |

\* cited by examiner

*Primary Examiner*—Walter L Lindsay, Jr.
(74) *Attorney, Agent, or Firm*—Dickstein, Shapiro, LLP.

(57) ABSTRACT

A resist post is formed on a connection pad of a semiconductor chip, and the semiconductor chip and the resist post are covered by a heat resistant insulating layer. A surface of the insulating layer is next polished by CMP or the like, thus an upper surface of the resist post being exposed. The exposed resist post is then removed by developing processing or the like, thus forming a through hole. A conductor is then embedded in the through hole by plating, thus forming a connecting conductor, and wirings are formed. A method of forming the connecting conductor does not impart damage to the semiconductor chip.

5 Claims, 11 Drawing Sheets

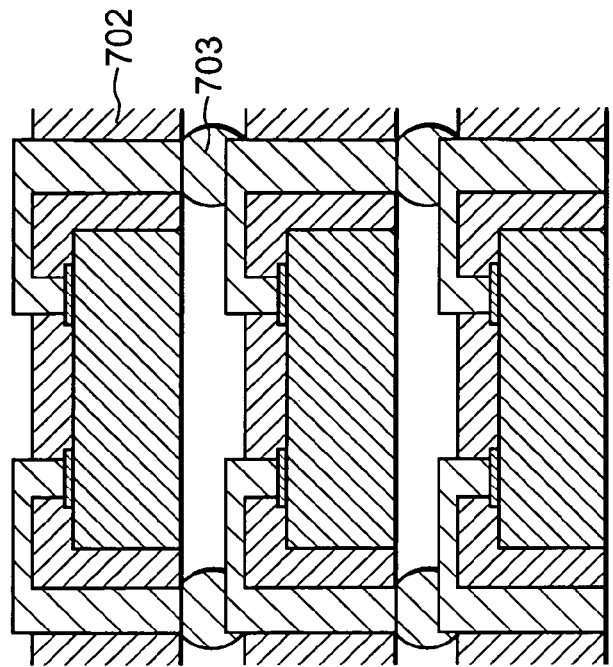
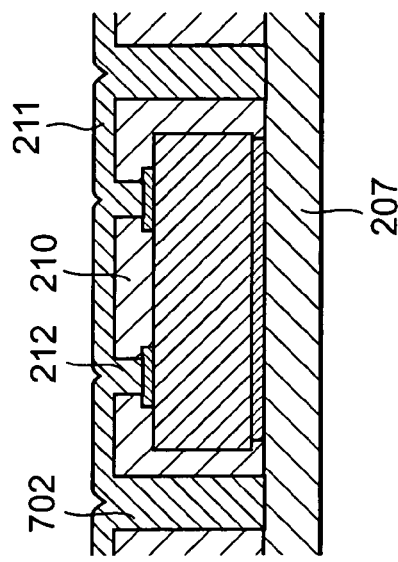
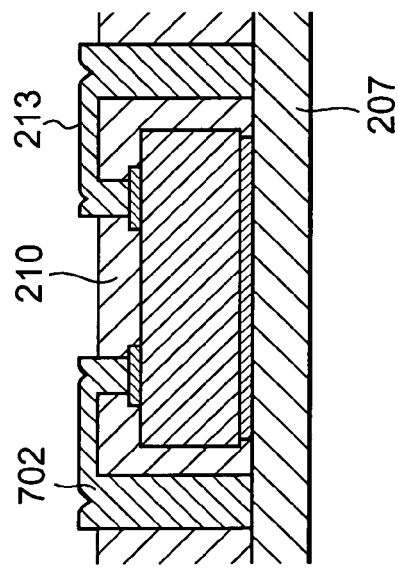

METHOD OF FORMING A CONNECTING CONDUCTOR AND WIRINGS OF A SEMICONDUCTOR CHIP

CROSS-REFERENCE TO RELATED APPLICATIONS

This application is a divisional of U.S. patent application Ser. No. 10/771,451, filed Feb. 5, 2004, now abandoned the entirety of which is incorporated herein by reference.

BACKGROUND OF THE INVENTION

1. Field of the Invention

The present invention relates to a method of forming a connecting conductor and wirings of a semiconductor chip. In particular, the present invention relates to a method of forming a connecting conductor connected to a connection pad and is suitable for a semiconductor chip mounted on a build-up multi-layer substrate, and to a method of forming wirings connected to the connecting conductor.

2. Description of the Related Art

Recent development of performance and miniaturization of IC chips require to increase a wiring density of a substrate on which an IC chip is mounted, and a number of pins provided to the substrate or the IC chip. A build-up multi-layer substrate can be given as an example of a present-day high density mounting substrate, which is practically used. An epoxy resin layer is formed on a glass epoxy substrate that serves as a core substrate, and holes are formed in the resin layer by laser processing or photoetching in the build-up multi-layer substrate. An conductive pattern or a via conductor is then formed on the epoxy resin layer by using a copper plating, and multiple layers are subsequently formed by repeating the same processes over and over, completing the build-up multi-layer substrate. The build-up multi-layer substrate is electrically connected to a semiconductor chip to form a semiconductor device. Such a semiconductor device that is described above is also disclosed in U.S. Pat. No. 5,111,278.

According to a technique disclosed in JP 2001-15650 A, for example, an insulating resin layer is formed on a semiconductor chip. Solder bumps can then be given a narrow pitch by processing holes in the insulating resin layer in which a conductive paste layer connecting pads of the build-up multi-layer substrate and pads of the semiconductor chip is formed.

In this manufacturing method, the holes are formed by irradiating a laser beam on the insulating resin layer on the connection pads, after sealing the semiconductor chip with the insulating resin. Such a laser processing, however, can cause damage in the semiconductor chip. Furthermore, the laser processing cannot contribute to making the semiconductor chip smaller, or to giving the connection pads on the semiconductor chip with a narrower pitch.

Further, JP 2001-15650 A also discloses a technique of forming a hole in an insulating resin layer by using chemical developing.

A strong etching material is usually used as a developer to etch an epoxy resin generally used as the insulating resin. It is, however, difficult to use a strong etching material because such a strong material causes damage in a semiconductor chip. It is therefore extremely difficult to form holes having a high aspect ratio in the processed hole. That is, it is extremely difficult to make holes having a numeric value found by dividing the hole depth by a diameter of the largest opening portion. Accordingly, the hole forming process by using a chemical development on an epoxy resin that is on a semiconductor chip cannot contribute to giving the connection pads on the semiconductor chip a more narrower pitch.

Furthermore, JP 11-233678 A discloses a method of forming a hole for connecting pads of a semiconductor chip and pads of a build-up multi-layer substrate. A photosensitive resin is formed on the semiconductor chip, and a conventional photofabrication technique is applied to the photosensitive resin, thus the holes being formed.

If a photosensitive resin is used in direct contact with the semiconductor chip, however, it is difficult to ensure reliability over a long term of use because the temperature of the semiconductor chip can reach 60° C. or more during use. When considering that there is a tendency of increase in the amount of heat that is generated per unit surface area of the semiconductor chip as the chip size is made smaller and the chip is given higher functionality, this manufacturing method cannot contribute to making the semiconductor chip smaller, and cannot contribute to giving the connection pads on the semiconductor chip a more narrower pitch.

SUMMARY OF THE INVENTION

An object of the present invention is to prevent a semiconductor chip from receiving physical damage and chemical damage in a process of forming a through hole in order to form a connecting conductor that connects a connection pad of the semiconductor chip with wirings.

Another object of the present invention is to form a conductor with which signal interference hardly occurs between a semiconductor chip and wirings, and between adjacent conductors, even if connection pads are given a narrow pitch based on a demand for further miniaturization or higher performance of the semiconductor chip or a semiconductor device.

A still another object of the present invention is to provide a method of forming a laminate semiconductor device in which a plurality of semiconductor devices are laminated.

A manufacturing process of a semiconductor device according to the present invention includes the steps of:

forming a resist post on a connection pad of a semiconductor chip;

forming an insulating layer that covers the semiconductor chip and the resist post;

polishing the insulating layer and exposing a surface of the resist post;

removing the resist post, forming a through hole, the connection pad exposed in a bottom surface of the through hole;

filling the through hole with a conductor, forming a connecting conductor; and forming wirings on the insulating layer, the wiring connected to the connecting conductor.

That is, a resist post that is an insulating columnar body is formed on a connection pad of a semiconductor chip, and an insulating layer (which supports the wiring afterward) made of an epoxy resin or the like is formed so as to cover the resist post and the semiconductor chip. A surface of the insulating layer is next polished by well-known CMP or the like, thus an upper surface of the resist post being exposed. The exposed resist post is then removed by developing processing or the like, thus a through hole being formed. Thereafter, the through hole is filled with a conductor by plating or the like, thus a connecting conductor being formed, and wirings are formed.

The resist post is thus formed in the region at which the connecting conductor is formed, and then is covered with the insulating layer. The insulating layer is then polished, a surface of the resist post being exposed. After that, the resist post is removed, a through hole used for a connecting conductor being formed. Accordingly, the semiconductor chip incurs no physical or chemical damage.

Further, because the through hole is formed as mentioned above, it becomes easy to form the through hole having an aspect ratio equal to or greater than one (where the term aspect ratio denotes a value in which the depth of the through hole is divided by a reduced radius of a surface that is parallel to an opening surface of the through hole, and that has a maximum surface area). A semiconductor chip or a semiconductor device possessing a connecting conductor formed by embedding a conductor in this through hole can prevent signal interference between the semiconductor chip and wirings, and between adjacent conductors, from occurring, even if connection pads are given a narrow pitch.

Furthermore, for cases in which a plurality of the semiconductor devices are laminated, a second resist post is formed on a support in addition to forming a first resist post on a connection pad. Next, a second connecting conductor that is connected to a first connecting conductor through wirings, is formed in a through hole left after removing the second resist post. The wiring of one semiconductor device is thus connected to a connecting conductor exposed in a rear surface of an insulating film of another semiconductor device. A laminate semiconductor device in which two or more semiconductor devices are laminated can thus be manufactured.

Furthermore, a heat resistant insulator in which a through hole is formed in advance may also be used instead of forming the resist post in the insulating layer described above. The heat resistant insulator may be bonded onto a semiconductor chip, and a connecting conductor may be formed by filling the through hole with a conductor by plating. In this case, formation of the through hole of the heat resistant insulator is performed in a state where the insulator is not connected to the semiconductor chip. Accordingly, it becomes possible to perform laser processing, etching by using a chemical agent, without harming the semiconductor chip.

BRIEF DESCRIPTION OF THE DRAWINGS

The above and other objects, advantages, and features of the present invention will become more apparent from the following description taken in conjunction with the accompanying drawings, in which:

FIGS. 7A to 7G are schematic cross sectional views for explaining a method of manufacturing a semiconductor device according to the third embodiment of the present invention;

DETAILED DESCRIPTION OF THE PREFERRED EMBODIMENTS

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
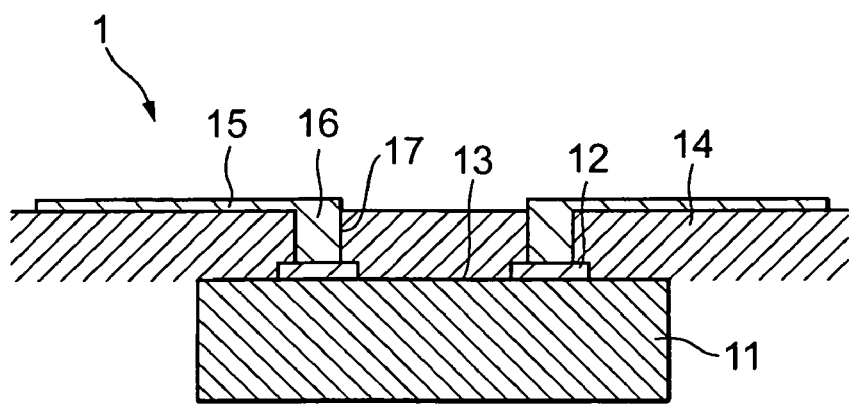
FIG. 1 is a schematic cross sectional view of a semiconductor device according to a first embodiment of the present invention.

FIG. 1 is a schematic cross sectional view of a semiconductor device according to a first embodiment of the present invention.

A semiconductor device 1 according to a first embodiment of the present invention comprises a semiconductor chip 11 provided with a connection pad (electrode terminal) 12 in at least one surface, an insulating layer 14 that is disposed on at least one surface 13 provided with connection pads 12 of the semiconductor chip 11, wirings 15 that are disposed on the semiconductor chip 11 through the insulating layer 14, and connecting conductors 16 that electrically connect the connection pads 12 and the wirings 15.

It should be noted that, in this embodiment the wirings 15 do not have a portion that is embedded in an inner portion of the insulating layer 14, and that the wirings 15 are formed on an upper surface of the insulating layer 14. That is, the wirings 15 are formed on a surface of the insulating layer 14 opposite to a surface that faces the semiconductor chip 11.

Further, in this embodiment the insulating layer 14 has at least one through hole 17. The insulating layer 14 is disposed so that the through hole 17 is disposed on the connection pads 12. The connecting conductors 16 are formed in at least a portion of an inner portion of the through hole 17.

It is preferable here that at least one of the through holes 17 have an aspect ratio equal to or greater than 1. The aspect ratio is a numerical value in which the depth of the through hole 17, that is, the thickness of the insulating layer 14, is divided by a reduced radius for a surface that has a maximum surface area and that is parallel to an opening surface of the through hole 17. A distance between the semiconductor chip 11 and the wirings 15 of an order where noise does not affect the functionality of the semiconductor device 1 is ensured, even if the semiconductor chip 11 is provided with connection pads having a narrow pitch, provided that the aspect ratio is equal to or greater than 1.

By thus disposing the insulating layer 14 on the connection pads 12 of the semiconductor chip 11, and providing function to give the connection pads 12 a narrow pitch for the insulating layer 14, it becomes easy to electrically connect the narrow pitch connection pads 12 of the semiconductor chip 11 with connection pads of a build-up multi-layer substrate.

Regarding the build-up multi-layer substrate that is disposed on the semiconductor device 1, an insulating layer may be formed on the insulating layer 14 that is provided with the wirings 15, and a portion of the insulating layer may be removed by using a conventional technique, thus a portion of the wirings 15 being exposed. The circuit board, for example the build-up multi-layer substrate, may then be disposed directly on the insulating layer 14.

It is preferable that an upper side surface of the insulating layer 14, which is a wiring support, be flat in this case because the build-up multi-layer substrate is disposed on the insulating layer 14. Preferably, the flatness of the upper side surface is equal to or less than 10 μm. If there is a portion having flatness greater than 10 μm in the upper side surface, the wirings of the build-up multi-layer substrate formed on the portion can break more easily.

Alternatively, a build-up multi-layer substrate made in advance by another process may also be connected on the wiring support 14 by a conventional technique. A conductive adhesive and a solder bump may also be used as a connection method.

In this case, connection regions having a pitch width that is larger than that of the connection pads of the semiconductor chip 11 may be formed on the insulating layer 14, and the connection regions may be electrically connected to the pads of the build-up multi-layer substrate. The positioning accuracy in a process of connecting the build-up multi-layer substrate and the insulating layer 14 is thus relieved compared to cases where the build-up multi-layer substrate is connected directly with the connection pads 12 of the semiconductor chip 11.

It should be noted that the material used in the insulating layer 14 should be selected by considering electrical characteristics such as insulating characteristics and dielectric characteristics, thermal characteristics such as the heat resistance, the thermal expansion coefficient, and the thermal conductivity, moisture absorption characteristics, and the like. Heat resistant resins such as epoxy resins, fluoride containing resins such as PVDF (polyvinylidene fluoride), and the like can be given as desirable materials. It should be noted that the desirable materials are also related to the method of manufacture used. This is discussed in detail in an explanation of a method of manufacturing a semiconductor device according to this embodiment.

Further, it is preferable that the wirings 15 and the connecting conductors 16 form a substantially continuous body, where connection interfaces between the wiring 15 and the connecting conductor 16 are not present. This is so that the generation of noise due to contact resistance originating in the connection interfaces, signal reflection at the connection interfaces, and the like, can be prevented.

In addition, it is preferable that the connecting conductors 16 completely fill the through holes 17. This is because the resistance from the connection pads 12 to the wirings 15 will increase as a result if voids are present. Further, for cases where the voids cannot be controlled by manufacturing processes, the voids will give rise to dispersion in the resistance values of the through holes 17. In addition, reliability in the capacity of the semiconductor device 1 drops for cases in which substances that change the electrical characteristics of the connecting conductors 16 remain within the voids after manufacturing.

A method of manufacturing a semiconductor device according to the first embodiment of the present invention is explained next while referring to the drawings.

FIGS. 2A to 2J are schematic cross sectional diagrams for explaining the method of manufacturing a semiconductor device according to the first embodiment of the present invention.

Figure 2A:
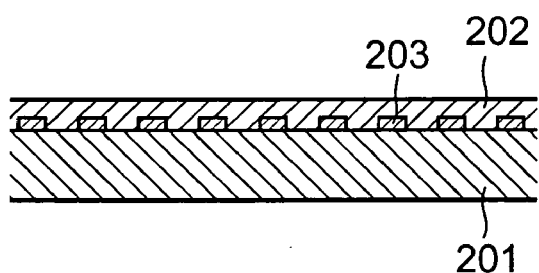
FIGS. 2A to 2J are schematic cross sectional views for explaining a method of manufacturing a semiconductor device according to the first embodiment of the present invention.

FIG. 2A shows a state where a photosensitive resin 202 is formed on a semiconductor wafer 201 on which connection pads 203 are formed.

Figure 2B:
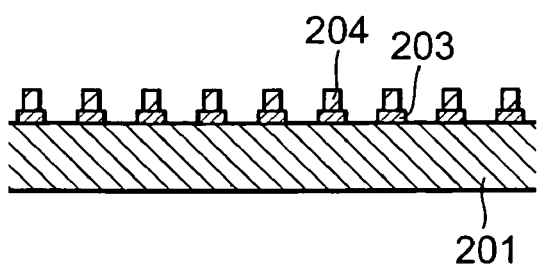

FIG. 2B shows a state where resist posts 204 made from the photosensitive resin 202 are formed on connection pads 203.

Figure 2C:
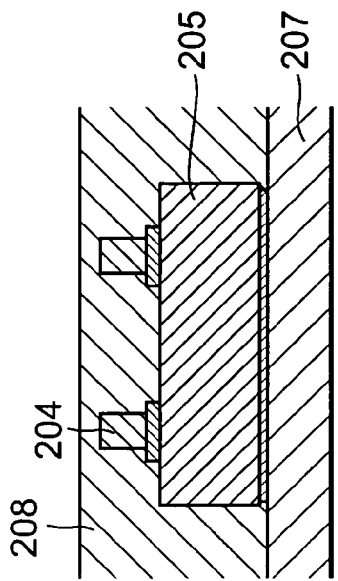

FIG. 2C shows a state where the semiconductor chip 205 is divided from the semiconductor wafer 201 shown in FIG. 2B. The semiconductor chip 205 is provided with the resist posts 204 on the connection pads 203.

Figure 2D:
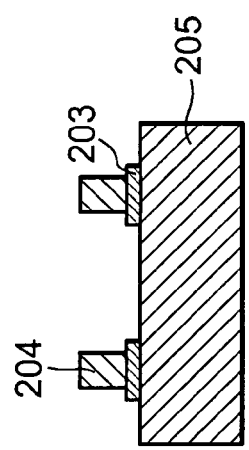

FIG. 2D shows a state where the semiconductor chip 205 is joined with a support member 207, through a peelable adhesive 206.

Figure 2E:
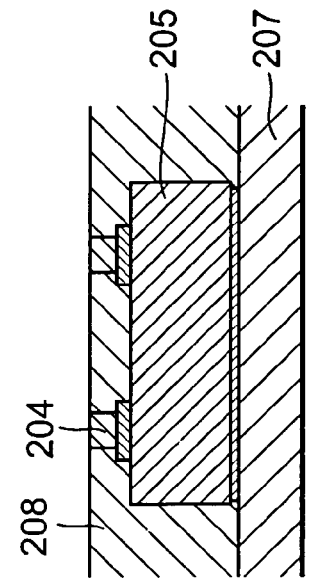

FIG. 2E shows a state where an electric insulator 208 is formed on the support member 207, the semiconductor chip 205 and the resist posts 204 formed on the semiconductor chip 205 being embedded.

Figure 2F:
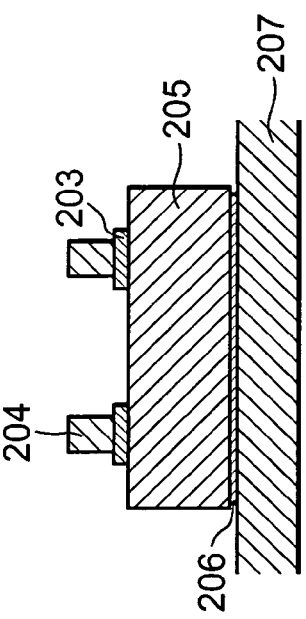

FIG. 2F shows a state where the electric insulator 208 is polished, thus the resist posts 204 embedded in the electric insulator 208 being exposed, and a flat surface in a surface of the electric insulator 208 being formed.

Figure 2G:
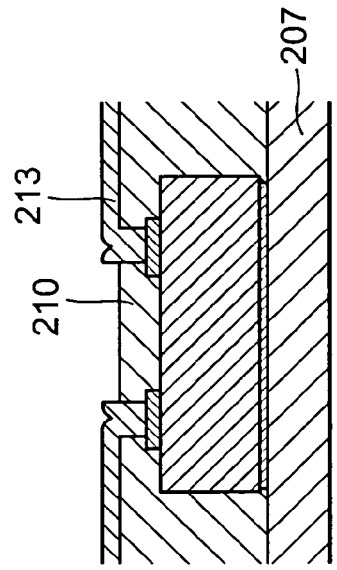

FIG. 2G shows a state where the resist posts 204 embedded in the electric insulator 208 are removed, thus an insulating layer 210 provided with through holes 209 being formed.

Figure 2H:
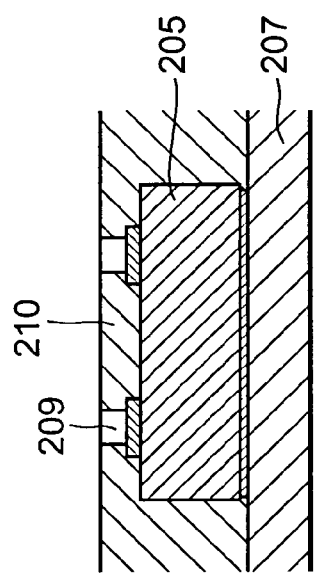

FIG. 2H shows a state where a connecting conductor 212 is formed in inner portions of the through holes 209 to electrically connect the connection pads 203 in a bottom surface of the through holes 209 and a wiring conductive layer 211 that is formed on a surface of the insulating layer 210.

Figure 2I:
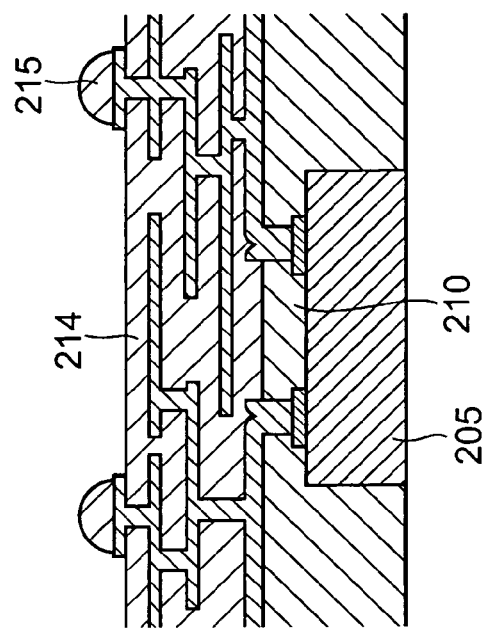

FIG. 2I shows a state where the wiring conductive layer 211 on the insulating layer 210 is partially removed, thus wirings 213 being formed.

Figure 2J:
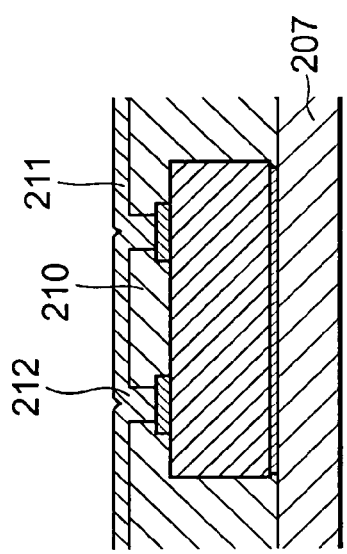

FIG. 2J shows a state where a build-up multi-layer substrate 214 that is electrically connected to the wirings 213 on the insulating layer 210 is formed, terminals 215 are formed on an opposite side of a surface of the build-up multi-layer substrate 214 that faces the semiconductor chip 205, and in addition, the support member 207 is removed.

The method of manufacture is explained in further detail hereinafter while referring specifically to the drawings.

First, referring to FIG. 2A, a layer of the photosensitive resin 202 is formed on the semiconductor wafer 201. Spin coating may be used in forming the layer, and a dispenser may also be used. The material used in the semiconductor wafer 201 may be one that has silicon as its main constituent, and may also be a material having a compound semiconductor such as gallium arsenide as its main constituent.

Further, there are no particular limitations of the material used for the photosensitive resin 202. A resin having negative type photosensitivity may be used for the photosensitive resin 202, as may a resin having positive type photosensitivity. However, the material should be determined by considering that the resist posts 204, which are made from the photosensitive resin 202, can be easily removed in a later process of removing the resist posts 204, shown in FIG. 2G. That is, a material that is easy to remove and that is capable of forming the resist posts 204 in desired shapes should be selected.

A specific example of a method of forming the layer by using the photosensitive resin 202 is shown below.

THB-150N resin for thick and negative resist film manufactured by JSR Corporation may be used as the photosensitive resin 202. The photosensitive resin 202 may be formed by spin coating. The spin coating conditions are an initial period rotation for 10 seconds at 300 rpm, and then increasing the rotation speed to 1,000 rpm for 20 seconds.

Heat treatment is performed next for 10 minutes at 110° C. as a pre-bake, thus forming a layer of the photosensitive resin 202 having a film thickness on the order of 70 μm.

Referring to FIG. 2B, the resist posts 204 are formed next on the connection pads 203 formed on the semiconductor wafer 201. The photosensitive resin 202 regulates the height of the resist posts 204. Further, each of the resist posts 204 may be formed on one of the connection pads 203. A bottom surface of the resist post 204, which is a surface that faces the connection pad 203, may contact the entire connection pad 203 and the semiconductor wafer 201 in the periphery of the contact pad 203. The bottom surface of the resist post 204 may also contact only a portion of the connection pad 203. It should be noted that it is preferable that the resist posts 204 have a shape where the surface area of a surface opposing the bottom surface is larger than the surface area of the bottom surface, and the horizontal cross area increases from the bottom surface side to a top surface side. The resist posts 204 made from the photosensitive resin 202 are easily removed in a process shown in FIG. 2F of removing the resists posts 204 when having this shape.

A specific example of a method of forming the resist post 204 from the layer of the photosensitive resin 202 is shown below.

A light from a mixture of g, h, and i rays is irradiated at 1,000 mj/cm$^2$, thus performing light exposure. Development is then performed for 190 to 210 seconds at a temperature of 23° C. by using a developer (PD523) made from an aqueous solution that contains 2.38% tetramethyl ammonium hydroxide. Washing is then performed for 120 seconds by using ultra purified water, thus the resist posts 204 being formed.

Referring to FIG. 2C, the semiconductor wafer 201 is then divided into individual pieces, thus the semiconductor chip 205 provided with the resist posts 204 on the connecting pads 203 being formed.

Referring to FIG. 2D, the semiconductor chip 205 is next joined to the support member 207 through the peelable adhesive 206. A foaming peelable sheet in which a joining force reduces due to foaming by heating to a temperature equal to or greater than a specific temperature may also be used for the peelable adhesive 206. In addition, adhesives that are made from materials having a particularly high solubility, or which easily swell, in a specific solvent compared to other materials of the semiconductor device manufactured by the method of manufacturing below may also be used. For example, silicone adhesives and the like, which have a particularly high solubility in solvents such as toluene, may be used. Alternatively, a porous adhesive layer may be used. The porous adhesive layer sponges a solvent, thus dissolving easily.

Referring to FIG. 2E, the heat resistant electric insulator 208 is formed next on the support member 207, embedding the semiconductor chip 205 and the resist posts 204 that are formed on the semiconductor chip 205. For the electric insulator 208, it is preferable to use a material whose fluidity can be changed. By using such a material, and supplying it on the semiconductor chip 205 and the support member 207 in a state having a suitable degree of fluidity, and then eliminating the fluidity, the electric insulator 208 can be disposed without voids developing in peripheral portions of the resist posts 204.

It is preferable that a screen printer or a dispenser be used for supplying the electric insulator 208 in a state having a suitable degree of fluidity so that the distance between a surface of the electric insulator 208 and the support member 207, that is, the thickness of the electric insulator 208, can be made nearly uniform. A spin coater, a doctor blade, or a curtain coater may also be used.

Further, thermosetting resins or photosetting resins may be used for the material of the heat resistant electric insulator 208 having the properties described above. Specifically, epoxy resins, phenol resins, imide resins, and cyanate resins that have high heat resistance, and fluoride resins, PTFE resins, PPO resins, and PPE resins that have low dielectric dissipation, resins in which these materials are modified, and the like are suitable as the insulating resin. Further, a compound in which these resins are mixed with an electrically insulating filler are also desirable. This is because it is easy to control the thermal expansion coefficient, the thermal conductivity, the dielectric constant, and the like by mixing the resin and the filler. Specifically, alumina, magnesia, zirconia, boric nitride, aluminum nitride, silicon nitride, PTFE resin, silica, and the like can be used as the filler. Additionally, the structure of the electric insulator 208 can be strengthened or made uniform by using a coupling agent or a dispersing agent.

In addition, the electric insulator 208 may also be manufactured by gasifying a liquid made from a dispersion liquid, in which an electrically insulating powder and a suitable binder are dispersed in a suitable liquid. Alumina, magnesia, zirconia, boric nitride, aluminum nitride, silicon nitride, PTFE resin, silica, and the like can be given as materials that can be used as the electrically insulating powder.

It should be noted that the electric insulator 208 is supplied on the support member 207 so as to embed the resist posts 204 within the electric insulator 208 in this embodiment. However, the electric insulator 208 may also be supplied on the support member 207 so that portions of the resist posts 204 are exposed from the electric insulator 208.

Referring to FIG. 2F, a polishing process is then performed on the surface of the electric insulator 208 that is opposite to the surface facing the semiconductor chip 201. Horizontal cross sections of the resist posts 204 are thus exposed in the polished surface of the electric insulator 208.

A specific example of a method in which the electric insulator 208 is processed by polishing is shown below.

A portion of the support member 207 is fixed to a fixing table that is provided with a polishing apparatus (for example, product DAG810 manufactured by DISCO Corporation). The rotational speed of a spindle of a grindstone is set to 3000 rpm, and the rotational speed of the fixing table is set to 100 rpm. Abrasion processing is then performed by using an abrasive on the order of, e.g., 600 grit until the resist posts 204 are exposed. The abrasive is then changed to one on the order of 2000 grit, and finishing is performed without changing the rotational speeds. The processing speed and the processed surface roughness can both be improved by using this method. Further, dressing may also be performed while polishing, that is, ELID processing may also be performed, by using an abrasive in which a hard material that does not tend to undergo electrolytic corrosion, such as diamond, is embedded in a base material that undergoes electrolytic corrosion, such as a ferrous material.

Next, the resist posts 204 that are exposed in the polished surface of the electric insulator 208 are removed. The method used for removing the resist posts 204 should be selected depending upon the material that is used in the resist posts 204. For example, for cases where the resist posts 204 more easily dissolve in a chemical agent, such as an acid or an alkali, than the electric insulator 208, the semiconductor chip 205, and the connecting pads 203, and for cases in which the resist posts 204 are made of a material that swells particularly easily by a specific organic solvent compared with the electric insulator 208, the resist posts 204 are preferentially removed by contacting the resist posts 204 in an appropriate chemical agent or solvent. Further, for cases in which the resist posts 204 are made of a material that is particularly easy to remove by using laser light, thermal and mechanical damage to the semiconductor chip 205 can be kept low if the resist posts 204 are removed by using laser light.

Referring to FIG. 2G, the through holes 209 with the connection pads 203 on the bottom surfaces are formed when the resist posts 204 that are exposed in the upper surface of the electric insulator 208 are removed. The insulating layer 210 provided with the through holes 209 is thus formed on the semiconductor chip 205.

It is possible to use a conventional technique as a method of removing the resist posts 204. A specific example is shown below.

The resist posts 204 are removed by immersing the manufacturing process piece shown in FIG. 2F in a liquid that contains from 96% to 99% dimethyl sulfoxide and 1% tetramethyl ammonium hydroxide (THB-S1), or a liquid that contains from 89% to 95% dimethyl sulfoxide and from 1 to 3% tetramethyl ammonium hydroxide (THB-S2) for 5 to 10 minutes at a temperature of 50° C. to 70° C., followed by washing. Ultrasonic vibration may also be added to the piece through the liquid at the same time is immersed in the liquid.

The through holes 209 thus manufactured by this manufacturing method are based on the resist posts 204 made from a photosensitive resin. Accordingly, it is possible to control the shape of the through holes 209 at least to a micrometer order. Further, the disposition error between the through holes 209 that are provided in the insulating layer 210 is also on the order of micrometers. It is preferable to make the shape of the through holes 209 into a shape having an aspect ratio equal to or greater than 1 by using this type of control. A spacing between the semiconductor chip 205 and the wirings, at which the influence of noise is reduced to an order where it does not influence the functionality of the semiconductor device, can be ensured provided that the aspect ratio is equal to or greater than 1, even if narrow pitch connection pads are used.

Referring to FIG. 2H, the wiring conductive layer 211 is formed next on the insulating layer 210. In addition, the connecting conductor 212 is formed in the inner portion of the through holes 209 to electrically connect the connection pads 203 in the bottom surface of the through holes 209 and the wiring conductive layer 211 that is formed on the surface of the insulating layer 210.

The wiring conductor 211 and the connecting conductor 212 may be formed by using different processes. Both are formed by using the same process in this embodiment, however. The wiring conductor 211 and the connecting conductor 212 thus form a substantially continuous body, and joining interfaces do not exist in any conductor. The development of contact resistance, signal reflection, and the like originating in the joining interface are prevented by thus not forming joining interfaces. The semiconductor device manufactured by the processes described above has little generation of noise or heat, and supports a more narrower pitch. Further, the number of process steps decreases by forming the two conductors in a lump, and this contributes to an increase in productivity in the method of manufacture, an increase in yield, and a reduction in cost of the manufactured product.

Electroplating is used as a method of forming the wiring conductor 211 and the connecting conductor 212 at the same time in this embodiment. Compared to other formation methods, electroplating has high manufacturing efficiency. The thickness of the wiring conductor 211 is set on the order of 10 μm in this embodiment. The thickness of about 10 μm prevents breaking of wirings within the build-up multi-layer substrate 214 due to a step between the wirings and substrate 214 from occurring for cases in which the build-up multi-layer substrate 214 is formed directly on the insulating layer 210 that is provided with the wirings 213 based on the wiring conductor 211.

It should be noted that electroless plating, or a dry process such as sputtering or ion plating may also be used in a conductor making process before the electroplating process. However, for cases where the through holes 209 are formed in a shape having a high aspect ratio, certain considerations should be made so that the bottom surface and side surfaces of the through holes 209 are made into conductors. If electroless plating is used, increasing the agitation speed and making a diffusion layer thickness thinner should be considered. If a dry process is used, the mean free path of a conductive substance should be increased by improving a degree of vacuum.

Referring to FIG. 2I, the wiring conductor 211 on the insulating layer 210 is next partially removed by using a conventional technique, for example photolithography and etching, thus forming the wirings 213.

Referring to FIG. 2J, the build-up multi-layer substrate 214 is then formed so as to electrically contact the wirings 213 that are formed on the insulating layer 210 and wirings within the build-up multi-layer substrate 214. The build-up multi-layer substrate 214 is manufactured according to a conventional technique. Next, terminals 215, such as solder balls, are formed according to a conventional technique in a surface of the build-up multi-layer substrate 214 that is opposite to a surface that faces the semiconductor chip 205. The support member 207 is then peeled away from the semiconductor chip 205, to which it is joined through the insulating layer 210 and the peelable adhesive 206.

The semiconductor device according to the first embodiment is thus made according to the processes described above.

It should be noted that, although the support member 207 is used in this embodiment, as shown in FIG. 2J, manufacturing may also be performed by using a support with a suitable attachment mechanism as a substitute for the support member 207, and only attaching the semiconductor chip 205 to the support.

Furthermore, for cases in which the support member 207 is employed, the support member 207 may be used as a heat dissipating member without peeling it away. In this case a heat resistant adhesive made from an epoxy resin, or the like, that is used in a conventional technique may be substituted for the peelable adhesive 206.

Alternatively, a process of selectively or preferentially removing the support member 207 may also be performed. For example, mechanical removal by a grinding process, a cutting process, or the like may be used. The support member 207 may be made of a material that easily dissolves in a specific solvent. Furthermore, a removal process that uses dry processing such as plasma ashing may also be added to these methods. In this case a heat resistant adhesive made from an epoxy resin, or the like, used in a conventional technique may be used as a substitute for the peelable adhesive 206.

Next, a semiconductor device according to a second embodiment of the present invention is explained while referring to the drawings.

Figure 3:
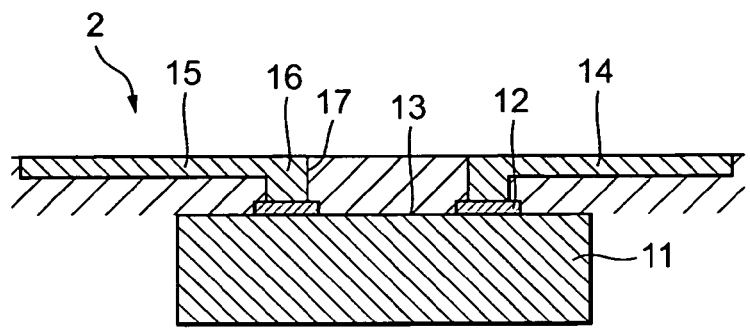
FIG. 3 is a schematic cross sectional diagram of a semiconductor device according to a second embodiment of the present invention.

FIG. 3 is a schematic cross sectional view of the semiconductor device according to the second embodiment of the present invention. It should be noted that reference symbols according to FIG. 1 are attached to elements in FIG. 3 that duplicate those of FIG. 1.

A semiconductor device 2 according to a second embodiment of the present invention comprises a semiconductor chip 11 provided with a connection pad (electrode terminal) 12 in at least one surface, an insulating layer 14 that is disposed on at least the surface 13 provided with connection pads 12 of the semiconductor chip 11, wirings 15 that are disposed on the semiconductor chip 11 through the insulating layer 14, and connecting conductors 16 that electrically connect the connection pads 12 and the wirings 15.

Furthermore, in this embodiment the insulating layer 14 has at least one through hole 17. The insulating layer 14 is disposed so that the through hole 17 is disposed on the connection pads 12. The connecting conductors 16 are formed in at least a portion of an inner portion of the through hole 17.

In addition, at least a portion of the wiring 15 is embedded in the insulating layer 14. In this embodiment, a step between the wirings 15 and a surface of the insulating layer 14 that is opposite to a surface facing the semiconductor chip 11 is smaller than the step in the first embodiment, for example equal to or less than 10 μm.

The insulating layer 14 is joined here to the semiconductor chip 11 in a state where the insulating layer 14 is provided with the through holes 17. By thus performing formation of the through holes 17 in advance, before joining the insulating layer 14 to the semiconductor chip 11, the semiconductor chip 11 does not receive any damage that accompanies a hole forming process performed on the insulating layer 14.

Accordingly, processing methods that could not be used as a fine processing method because of a concern that the semiconductor chip 11 will be damaged during hole formation can now be used as hole forming methods. It is therefore easy to support the chip 11 that is provided with narrow pitch connecting pads. Specifically, a process that employs a laser that uses femtosecond pulses, a removing process using an ion beam or a micro punching process, a process of accelerating fine particles and impacting them, etching by a chemical agent and employing a laser to increase directionality, and the like may be used.

Alternatively, it is possible to form a plurality of the insulating layers 14 all at once by using a large size substrate, divide the insulating layers 14 into individual pieces, and then join them to the semiconductor chips 11. Therefore, the through holes 17 may be formed all at once before dividing the insulating layers 14 into individual pieces.

Further, the through holes 17 may also be formed by a molding processing method as a method of fine processing. In this case the insulating layer 14 may be formed separately having rough through holes, and only a periphery portion of the through hole 17 may be formed by molding. Alternatively, the insulating layer 14 and the through holes 17 may also be formed at the same time by the molding process.

It should be noted that an adhesive layer may also be used in the joining portion between the insulating layer 14 and the semiconductor chip 11. Alternatively, the insulating layer 14 and the semiconductor chip 11 may also be connected without using the adhesive layer. For example, the insulating layer 14 and the semiconductor chip 11 may be connected by an anchor effect.

Further, it is preferable here that at least one of the through holes 17 have an aspect ratio equal to or greater than 1. A spacing between the semiconductor chip 11 and the wirings 15 of an order where noise does not influence on the functionality of the semiconductor device 2 is ensured, even if the semiconductor chip 11 is provided with connection pads having a narrow pitch, provided that the aspect ratio is equal to or greater than 1.

In addition, the thickness of the wirings 15 may be increased for cases in which the wirings 15 are embedded in the insulating layer 14, by making the embedded depth of the wirings 15 deeper, even if the step between the upper surface of the insulating layer 14 and the wiring 15 is small.

Accordingly, the cross sectional area of each of the wirings 15 can be ensured, the mutual gaps between the wirings 15 can be ensured, and control of the step between the wirings 15 and the insulating layer 14 can be achieved at the same time, even if the wiring pitch of the wirings 15 is narrow.

The semiconductor device 2 provided with this structure is therefore one in which the wiring resistance value is low, even if the connection pads 12 are given a narrow pitch, and there is little interference of signals between wirings. In addition, wirings within the build-up multi-layer substrate formed on the semiconductor device 2 do not easily break.

A method of manufacturing a semiconductor device according to the second embodiment of the present invention is explained next while referring to the drawings.

FIGS. 4A to 4E are schematic cross sectional diagrams for explaining the method of manufacturing a semiconductor device according to the second embodiment of the present invention. Note that, in FIGS. 4A to 4E, structures overlapping with those in FIGS. 2A to 2J are denoted by the same reference numerals.

Figure 4A:
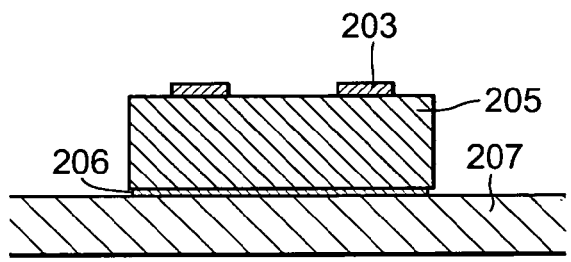
FIGS. 4A to 4E are schematic cross sectional views for explaining a method of manufacturing a semiconductor device according to the second embodiment of the present invention.

FIG. 4A shows a state where the semiconductor chip 205 is joined to the support member 207 through the peelable adhesive 206.

Figure 4B:
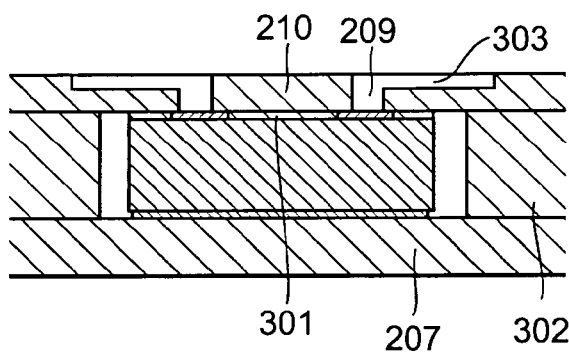

FIG. 4B shows a state where the separately made insulating member 210 is joined to the semiconductor chip 205 through the adhesive 301.

Figures 2, 4B:
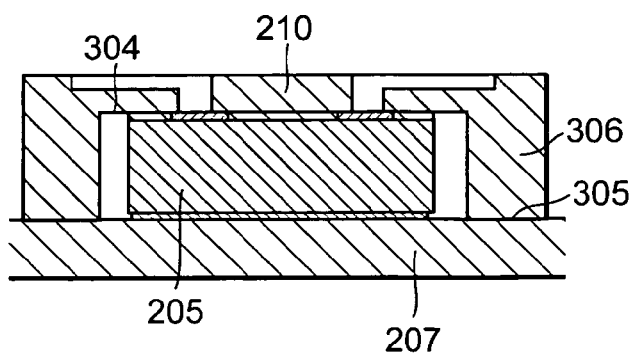

FIG. 4B-2 shows a example of the second embodiment in which the insulating member 210 has a concave shape.

Figure 4E:
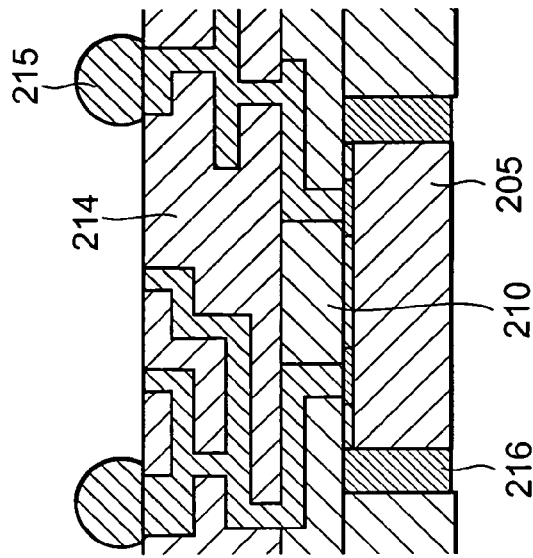
Figure 4C:
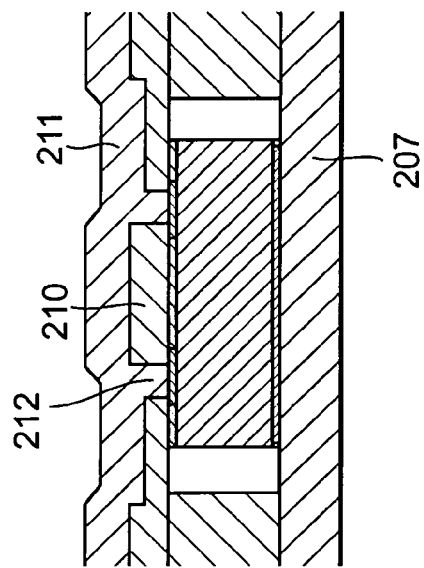

FIG. 4C shows a state where a conductor is formed in an inner portion of the through holes 209. The conductor electrically connects the connection pads 203 in the bottom surface of the through holes 209 that are provided to the insulator 210 and the wiring conductor 211 that is formed in the surface of the insulator 210.

Figure 4D:
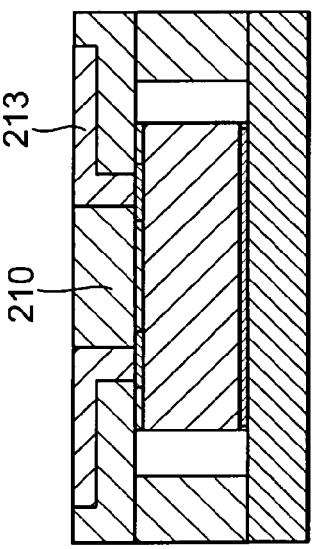

FIG. 4D shows a state where the wiring conductive layer 211 on the insulator 210 is partially removed, forming wirings 213. At least a portion of each of the wirings 213 is embedded in the insulator 210.

FIG. 4E shows a state where the build-up multi-layer substrate 214 that is electrically connected to the wirings 213 on the insulator 210 is formed. The terminals 215 are formed on the build-up multi-layer substrate 214 on a side opposite to a surface that faces the semiconductor chip 205. In addition, the support member 207 is removed.

A method of manufacture is explained in detail hereinafter while referring to the drawings. It should be noted that an explanation of content that duplicates that of the first embodiment is suitably omitted from the following explanation.

First, the semiconductor wafer 201 is divided into individual pieces, forming the semiconductor chip 205 that is provided with the connection pads 203. Referring to FIG. 4A, the semiconductor chip 205 is then joined to the support member 207 through the peelable adhesive 206. Materials preferable for use as the adhesive 206 are similar to those described in the first embodiment.

Referring to FIG. 4B, the insulator 210 formed separately is then disposed on the semiconductor chip 205 through an adhesive 301. The adhesive 301 is then set, fixing the insulator 210 on the semiconductor chip 205. The insulator 210 may have a concave shape as shown in FIG. 4B-2, and the insulator 210 may be connected to the semiconductor chip 205 at a bottom surface 304 of the concave shape. The insulator 210 may contact the support member 207 at an opening surface 305 of a peripheral edge 306 of the concave shape. Further, the insulator 210 may have a substantially flat plate shape as shown in FIG. 4B. A stiffener 302 having a height that is substantially equal to that of the semiconductor chip 205 may be disposed on the support member 207 in advance in the periphery of the semiconductor chip 205. The insulator 210 may contact the stiffener 302 and the semiconductor chip 205.

It should be noted that a void portion in the periphery of the semiconductor chip 205 may be filled by using an epoxy resin or the like. In this case, the semiconductor device is inverted after peeling the support member 207 from the semiconductor chip 205, thus an opening of the void portion being placed in an upper side. A sealing resin is then supplied by using a dispenser or the like, and a setting process may be performed if necessary.

Further, the insulator 210 in the semiconductor device according to this embodiment is provided with the through holes 209 and wiring grooves 303 in advance at a stage before joining to the semiconductor chip 205.

By thus performing formation of the through holes 209, before joining the insulator 210 to the semiconductor chip 205, the semiconductor chip 205 does not receive any damage that accompanies a process of forming holes in the insulator 210. Accordingly, processing methods that could not be used as a processing method of forming holes on the semiconductor chip 205 because of a concern that the semiconductor chip 205 will be greatly damaged during hole formation can now be used as hole forming methods with the semiconductor device according to this embodiment. It is therefore easy to support the semiconductor chip 205 that is provided with narrow pitch connection pads.

Specific examples include a process that employs a laser that uses femtosecond pulses, a removal process that uses an ion beam, a micro punching process, a process of accelerating fine particles and impacting them, etching by a chemical agent and employing a laser to increase directionality.

Alternatively, the through holes 209 may also be formed by using a molding processing method as a method of fine processing. In this case the insulating layer 210 may be formed separately having rough through holes, and only a periphery portion of the through hole 209 may be formed by molding. It is necessary to mold the periphery of the through holes 209 of the insulator 210 with high precision. However, it is not necessary to use a processing precision as high as that used for the through holes 209 in other portions of the insulator 210. Therefore such a separate molding shortens a molding time, expands a latitude in selecting the molding materials and in the design of a fabrication mold. Further, the insulating layer 210 and the through holes 209 may also be formed at the same time by the molding process. Batch molding will of course increase the manufacturing efficiency. It should be noted that compression molding, transfer molding and injecting molding, and the like may be used as a molding method.

A specific example of a method of making the insulating layer by transfer molding is shown here. A movable male die and a movable female die are contacted by adding pressure, thus forming a void portion (cavity) in which the insulator 210 is formed. With the cavity in a residually heated state, a thermosetting epoxy resin is supplied from one side of the mold, for example from the female die side, at an injection force of 80 kg and an injection velocity of 1.2 mm/s. The resin supplied within the cavity is then held for 90 seconds by a metal mold temperature of 175° C. to 180° C., thus set and forming the insulator 210 within the cavity. The mold is cooled next, and then opened. The insulator 210 is then taken out of the mold.

Further, it is also possible to form a plurality of the insulating layers 210 all at once by using a large size substrate, divide the insulating layers 210 into individual pieces, and then join them to the semiconductor chips 205. The through holes 209 may therefore be formed at once in a state where the plurality of the insulating layers 210 are formed at the same time. In this case a processing technique that can handle a large surface area, such as etching using a chemical agent or etching using an ECR plasma, is used, thus increasing the manufacturing efficiency. Further, an increase in the manufacturing efficiency can also be expected if a relatively sequential type processing method such as micro-punching or laser processing is used because a positioning process can be omitted.

Furthermore, by joining the insulator 210, in which the wiring grooves 303 are formed in advance, and the semiconductor chip 205, the semiconductor chip 205 does not receive damage that accompanies a groove forming process performed on the insulator 210.

Cutting, grinding, press forming, laser processing, etching by using a chemical agent, etching by using a dry process, molding, and the like may be used as a groove forming method.

Pressing may be performed with the insulator 210 in a softened state, such as a gel state, and the insulator 210 is then hardened after groove formation. Alternatively, a thermoplastic material may be used as the insulator 210 material. A groove formation portion of the mold is heated to a temperature equal to or greater than the glass transition temperature of the material, and then pressing is performed.

With etching, direct etching of the material that constitutes the insulator 210 may be performed. A photosensitive resin layer is formed on the insulator 210. The photosensitive resin layer is then etched, thus the wiring grooves 303 and the through holes 209 being formed by using the photosensitive resin as a mask.

With molding, it is preferable to form the wiring grooves 303 and the through holes 209 by the same molding process from the viewpoint of increasing the manufacturing efficiency and the processing precision. Further, in order to additionally increase the manufacturing efficiency, the wiring grooves 303, the through holes 209, and the insulator 210 may all be formed at the same time.

Materials for the insulator 210 that are preferable for the manufacturing method of this embodiment are explained here.

Basically, the material is selected by considering the characteristics that must be satisfied as a semiconductor device part. That is, the material is selected by considering electrical characteristics such as dielectric characteristics and insulating characteristics, thermal characteristics such as the withstand temperature, the thermal expansion coefficient, and the thermal conductivity, and in addition, the moisture absorption characteristics and the like. In addition, the through holes 209 and the wiring grooves 303 are formed in the insulator 210 in this embodiment, and therefore the material is selected while considering processability. For cases where cutting, grinding, or micro-punching is performed, a relatively hard resin like a phenol resin may be used from the viewpoint of increasing processing precision. Alternatively, a sintered ceramic such as alumina or zirconia may be used. For cases in which laser processing is performed, the processing efficiency increases by using a material having a large absorption in the wavelength which the laser light has. For example, the processing precision increases if a material such as polyimide or polysulfone is employed when using an excimer laser.

For cases where molding is performed, materials whose fluidity is capable of being controlled may be used. Therefore materials that are similar to the materials of the insulator 210 (electric insulator 208) according to the first embodiment may be used.

For cases in which pressing is performed, it is preferable to use a material that has plastic deformation characteristics. Further, the processing precision increases by performing press processing when the insulator 210 is in a soft state if using a hardening material whose degree of setting can be controlled, or if using a material having thermoplastic characteristics. In addition, the processing precision increases by performing pressing with only a processing region heated to a temperature equal to or greater than its glass transition temperature if a material having thermoplastic characteristics is used.

It should be noted that as the adhesive 301 an epoxy resin or the like used by a conventional technique may be used. Further, a micro-dispenser or spin coater may also be used for supplying the resin.

Furthermore, the insulator 210 and the semiconductor chip 205 may also be joined in direct contact without using the adhesive 301. If the insulator 210 is made from thermoplastic resin, and the insulator 210 and the semiconductor chip 205 are contacted in a state where a surface of the semiconductor chip 205, which joins the insulator 210, is locally heated, a joining interface having a suitable joining force due to an anchor effect or chemical joining of a resin and a semiconductor, or the like, is formed.

Referring to FIG. 4C, the wiring conductive layer 211 is formed next filling at least an inner portion of the wiring grooves 303 on the insulator 210. Further, the connecting conductor 212 is formed in the inner portion of the through holes 209, thus electrically connecting the connection pads 203 in the bottom surfaces of the through holes 209 and the wiring conductive layer 211 that is formed on the insulator 210.

Preferable processes and materials for use in the wiring conductive layer 211 and the connecting conductor 212 are similar to those of the first embodiment.

An unnecessary portion of the wiring conductive layer 211 on the insulator 210 is removed next. Short circuits thus do not develop between adjacent wiring conductive layers 211 that fill the wiring grooves 303. It is preferable to use a polishing process such as chemical mechanical polishing (CMP) as a removal method. The wirings 213 are formed as a result. At least a portion of each of the wirings 213 is embedded in the insulator 210, as shown in FIG. 4D.

The wirings 213 and the insulator 210 are made of different materials here, and thus their removal processing rates differ. Accordingly, a small step develops between the wirings 213 and the insulator 210 in the processed surface after removal. In order to prevent a wiring within the multi-layer substrate from breaking, it is preferable that the step be equal to or less than 10 μm for cases in which a build-up multi-layer substrate is formed on the insulator 210.

Referring to FIG. 4E, the build-up multi-layer substrate 214 is formed next so as to electrically contact the wirings 213 that are formed on the insulator 210 and wirings within the build-up multi-layer substrate 214. The build-up multi-layer substrate 214 is manufactured according to a conventional technique. Next, terminals 215 are formed according to a conventional technique from solder balls or the like on an opposite side of a surface of the build-up multi-layer substrate 214 that faces the semiconductor chip 205. The support member 207 is then peeled away from the semiconductor chip 205, to which it is joined through the insulator 210 and the peelable adhesive 206. The gap in the periphery of the semiconductor chip 205 is then filled with an epoxy resin 216 or the like, as described above.

The semiconductor device relating to the second embodiment is thus made by the processes described above.

It should be noted that although the support member 207 is used in this embodiment, as shown in FIG. 4E, manufacturing may also be performed by using a support with a suitable attachment mechanism as a substitute for the support member 207, and only attaching the semiconductor chip 205 to the support.

Furthermore, for cases in which the support member 207 is employed, the support member 207 may be used as a heat dissipating member without peeling it away. In this case a heat resistant adhesive made from an epoxy resin, or the like, that is used in a conventional technique may be substituted for the peelable adhesive 206.

Alternatively, a process of selectively or preferentially removing the support member 207 may also be performed. For example, mechanical removal by a grinding process, a cutting process, or the like may be used. The support member 207 may be made of a material that easily dissolves in a specific solvent. Furthermore, a removing process that uses dry processing such as plasma ashing may also be added to these methods. In this case a heat resistant adhesive made from an epoxy resin, or the like, used in a conventional technique may be used as a substitute for the peelable adhesive 206.

Further, the semiconductor device according to the first embodiment may also be manufactured by using the manufacturing method according to this embodiment. In this case the insulator 210 that is not provided with the wiring grooves 303 is used. After forming the wiring conductive layer 211, the wiring conductive layer 211 may be partially removed by using a conventional photofabrication technique, thus forming the wirings 213.

Alternatively, the semiconductor device according to this embodiment may also be manufactured by adding manufacturing processes that are used by the manufacturing method of this embodiment to the manufacturing method of the first embodiment. For example, the wiring grooves 303 may be formed by using pressing, etching, laser processing, or the like in the state shown in FIG. 2F. If the resist posts 204 are next removed, a state results that is substantially similar to that of FIG. 4B. The semiconductor device according to this embodiment may thereafter be manufactured according to the manufacturing method described above.

It should be noted that, in the process of forming the wiring grooves 303, the semiconductor chip 205 and a press die don't contact each other, laser light is not irradiated directly to the semiconductor chip 205, and there is no direct contact between the semiconductor chip 205 and an etchant. The amount of damage that the semiconductor chip 205 receives in the process of this embodiment is therefore smaller than that received in the hole forming process.

Next, a semiconductor device according to a third embodiment of the present invention is explained while referring to the drawings.

Figure 5:
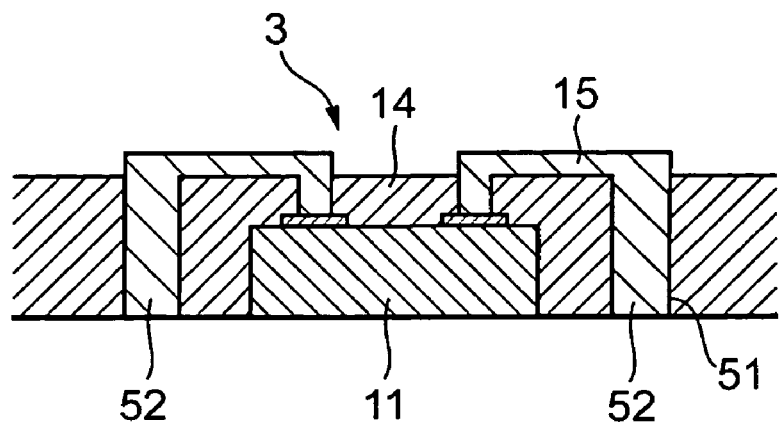
FIG. 5 is a schematic cross sectional view of a semiconductor device according to a third embodiment of the present invention.
Figure 6:
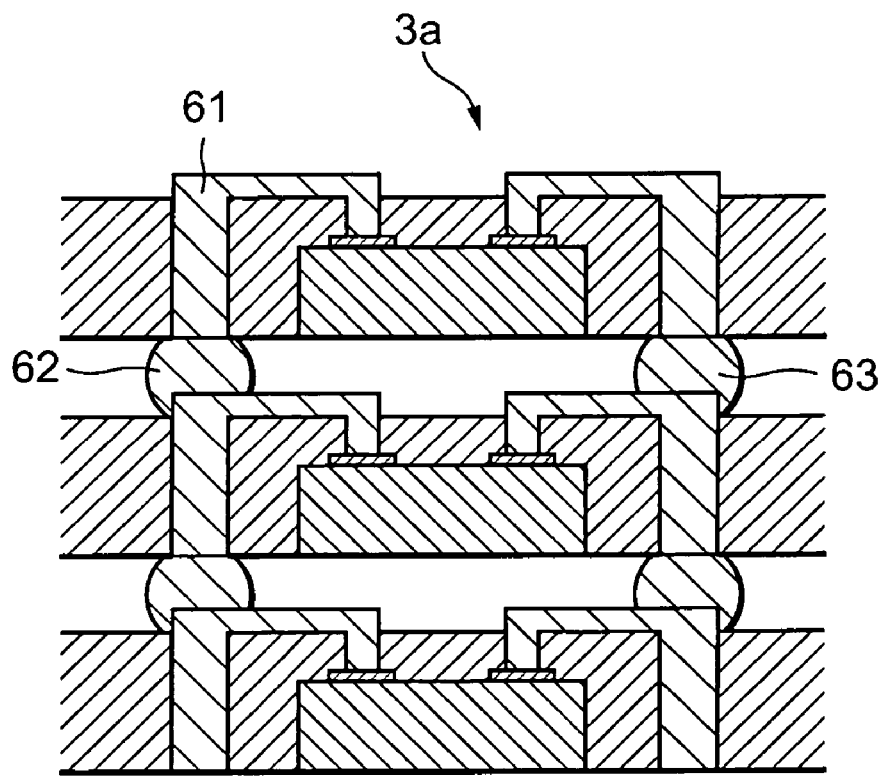
FIG. 6 is a cross sectional view that shows schematically a state in which the semiconductor devices according to the third embodiment of the present invention are laminated.

FIG. 5 is a schematic cross sectional view of a semiconductor device according to a third embodiment of the present invention, and FIG. 6 is a cross sectional view that shows schematically a state in which the semiconductor devices according to the third embodiment of the present invention are laminated.

It should be noted that reference symbols according to FIG. 1 are attached to elements in FIGS. 5 and 6 that duplicate those of FIG. 1.

A semiconductor device 3 of the third embodiment of the present invention is provided with a structure that is similar to that of the first embodiment, and the insulating layer 14 is also disposed in the periphery of the semiconductor chip 11. In addition, the semiconductor device 3 is provided with second connecting conductors 52 in the periphery of the semiconductor chip 11 in order to perform electrical connection of the semiconductor device 3 and an outside portion. The second connecting conductors 52 are disposed in this embodiment to fill second through holes 51 that are provided in the insulating layer 14. At least one of the second connecting conductors 52 is electrically connected with the wiring 15 disposed on the semiconductor chip 11, through the insulating layer 14.

A laminate 3a of the semiconductor device 3 is formed as shown in FIG. 6 by laminating a plurality of the semiconductor devices 3, and taking upper and lower end surfaces 61 and 62 of the second connecting conductors 52 as electrical connection points. Metallic bumps, for example solder bumps, may be used for third connecting conductors 63 that carry out the mutual connection between each of the semiconductor devices 3, and a conductive paste may also be used.

It should be noted that, although two surfaces of the second connecting conductors 52 are exposed in two surfaces of the semiconductor devices 3 in order to form the laminate 3a in this embodiment, only one end surface may also be exposed as a region for making an electrical connection with the outside portion. In this case as well, there are advantages as described below compared to forming a region for making a connection to the outside portion in a portion of the wiring.

The third connecting conductors 63 are formed in the regions that perform connections of the semiconductor devices 3 and the outside portion. Electrical connections with substrate wirings or other components are performed through the third connecting conductors 63. The connections between the connecting regions of the semiconductor device 3 and the third connecting conductors 63, and between the third connecting conductors 63 and external connection portions such as substrate wirings are not simple contacts. Thermal or mechanical processing is performed, and processing in order to form a physical joint is often performed. This is in order to ensure long-term reliability of the electrical connections at the connection points. Mechanical loads are therefore applied locally in the connection regions of the semiconductor device 3.

Therefore, if a portion of the wiring 15 having the thickness of several tens of micrometers is used as a connection region, there is a danger that wiring breakage will occur in an internal portion of the connecting region or in other portions of the wiring 15 due to the applied load.

By forming the second connecting conductors 52, which have a structure that does not break as easily due to connection processing as the wiring 15, and by performing electrical connections with the outside portion by using the second connecting conductors 52, the occurrence of failures due to connection processing can be prevented.

A method of manufacturing a semiconductor device according to the third embodiment of the present invention is explained next while referring to the drawings.

FIGS. 7A to 7G are schematic cross sectional diagrams for explaining the method of manufacturing a semiconductor device according to the third embodiment of the present invention. It should be noted that reference symbols according to FIGS. 2A to 2J are attached to elements in FIGS. 7A to 7G that duplicate those of FIGS. 2A to 2J.

Figure 7C:
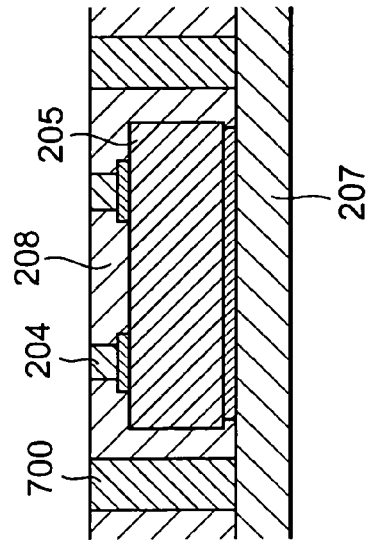
Figure 7D:
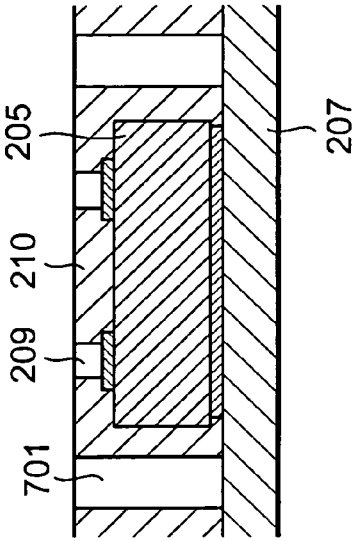
Figure 7A:
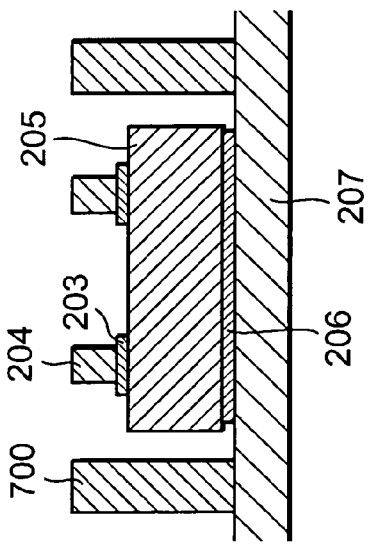

FIG. 7A shows a state where the semiconductor chip 205 provided with the first resist posts 204 on the connection pads 203 is joined to the support member 207 through the peelable adhesive 206. Second resist posts 700 are also disposed on the support member 207.

Figure 7B:
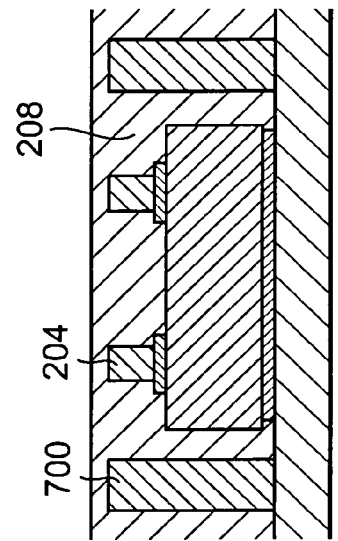

FIG. 7B shows a state where the electric insulator 208 is formed on the support member 207, embedding the semiconductor chip 205, the first resist posts 204 formed on the semiconductor chip 205, and the second resist posts 700.

FIG. 7C shows a state where the electric insulator 208 is polished, the first resist posts 204 and the second resist posts 700 that are embedded in the electric insulator 208 being exposed and a flat surface in the surface of the electric insulator 208 being formed.

FIG. 7D shows a state where the first resist posts 204 and the second resist posts 700 that were exposed in the flat surface are removed, thus the insulating layer 210 provided with the through holes 209 and through holes 701 is formed.

FIG. 7E shows a state where the connection pads 203 in the bottom surface of the through holes 209 are electrically connected with the wiring conductive layer 211 that is formed on the insulating layer 210. The connecting conductor 212 is formed filling the inner portions of the through holes 209. The connection members 702 are formed filling the inner portions of the second through holes 701. The connection members 702 are electrically connected to the wiring conductive layer 211.

FIG. 7F shows a state where the wiring conductive layer 211 on the insulating layer 210 is partially removed, the wirings 213 being formed.

FIG. 7G shows a state where the support member 207 is removed, and a plurality of the semiconductor devices are laminated through third connecting conductors 703 that are connected to upper and lower end surfaces of connection members 702.

A method of manufacture is explained in detail hereinafter while referring to the drawings. It should be noted that an explanation of content that duplicates that of the first embodiment is suitably omitted from the following explanation.

First, manufacturing processes similar to those of the first embodiment are performed, and a semiconductor chip 205 in which the first resist posts 204 are provided on the connection pads 203 is prepared. Next, the second resist posts 700 are formed on the support member 207 by using a photosensitive resin. A method of forming the second resist posts 700 is similar to the method of forming the first resist posts 204 that is explained by the first embodiment. Further, materials and shapes preferable for the second resist posts 700 are similar to the materials and the shapes that are preferable for the first resist posts 204. However, the height of the second resist posts is set substantially equivalent to the distance between upper end surfaces of the first resist posts 204, and a surface of the support member 207 on which the semiconductor chip 205 is joined to the support member 207 through the adhesive 206. At minimum, the height of the second resist posts 700 is set larger than the distance between the connection surface in which the connection pads 203 and the first resist posts 204 are connected each other, and the connection surface in which the support member 207 and the connection member 702 are connected each other. The height is thus set so that the end surfaces of the first resist posts 204 and the surfaces of the second resist posts 700 are exposed in the surface of the electric insulator 208 by subsequently performing a polishing process.

Referring to FIG. 7A, the semiconductor chip 205 is then joined on the support member 207 that is provided with the second resist posts 700, through the peelable adhesive 206.

The semiconductor chip 205 is joined at this point such that the second resist posts 700 are disposed in the periphery of the semiconductor chip 205.

Referring to FIG. 7B, the electric insulator 208 is formed next on the support member 207, embedding the semiconductor chip 205, the first resist posts 204 formed on the semiconductor chip 205, and the second resist posts 700 formed in the periphery of the semiconductor chip 205. It should be noted that it is acceptable if at least one of the first resist posts 204 and the second resist posts 700 is not buried in an electrical insulator.

Referring to FIG. 7C, the surface of the electric insulator 208 that is opposite to the surface that faces the semiconductor chip 205 is then ground or polished, thus horizontal cross sections of the first resist posts 204 and the second resist posts 700 being exposed in the polished surface of the electric insulator 208. It should be noted that a flat surface is formed in the upper surface of the electric insulator 208 at this point.

Referring to FIG. 7D, the first resist posts 204 and the second resist posts 700 are removed next. The first through holes 209 with the connection pads 203 at their bottom surfaces, and the second through holes 701 with the support member at their bottom surfaces, are thus formed, and the electric insulator 208 whose surface has been made flat is thus made into the insulating layer 210.

Referring to FIG. 7E, the inner portions of the first through holes 209 are then filled with the connecting conductor 212 that is formed by plating. Connecting conductors 212 that electrically connect to the connection pads 203 at the bottom surfaces of the first through holes 209 are thus formed. In addition, the wiring conductor 211 is formed in succession on the surface of the insulating layer 210. At this point the connection members 702 also fill inner portions of the second through holes 701. Thus, the connection members 702 that electrically connect to the connecting conductors 212 are also formed at the same time.

That is, similar to the first embodiment, the wiring conductive layer 211 and the connecting conductors 212 are made in succession by the same electroplating process in this embodiment. Therefore, connection interfaces between the conductive layer 211 and connecting conductors 212 do not exist. Further, the wiring conductive layer 211 and the connectors 702 are also made by the same electroplating process, and the wiring conductive layer 211 and the connectors 702 are also continuous.

As a result of the processes described above, the wiring conductive layer 211 that is formed on the surface of the insulating layer 210 and the connection pads 203 in the bottom surfaces of the first through holes 209 are electrically connected. In addition, the wiring conductive layer 211 and the connection members 702 are electrically connected.

It should be noted that, although the through holes 701 are filled with the wiring conductive layer 211 in this embodiment, it is not always necessary to fill whole of the through holes 701. There may also be unfilled portions. However, in this case, it is very important to make certain that the degree to which the through holes 701 are not filled exerts no adverse influence on resistance values in particular for the characteristics of the semiconductor device.

A portion of the wiring conductive layer 211 may then be removed if necessary by using a polishing process such as CMP, thus the wirings 213 being formed. Referring to FIG. 7F, at least a portion of the connection pads 203 and the connectors 702 are electrically connected as a result.

The support member 207 is removed next by using a method similar to those used in the manufacturing methods described in the pervious embodiments, and the semiconductor device according to this embodiment is complete. The third connecting conductors 703 made of solder bumps or the like are then connected to upper and lower surfaces of the connection members 702. If a plurality of the semiconductor devices are laminated together by electrically connecting the connection members 702 that are provided to each of the semiconductor devices, through the third connecting conductors 703, a semiconductor device laminate like that shown in FIG. 7G is formed.

It should be noted that, although the support member 207 is removed in this embodiment, the support member 207 need not be removed, and may instead be used as a heat radiating disc of the semiconductor chip 205, for example. In this case, a conventionally used heat resistant adhesive made from an epoxy resin or the like may be used as a substitute for the peelable adhesive 206 that is employed between the semiconductor chip 205 and the support member 207. Further, it becomes possible to use the connection members 702 as wirings for a plurality of types of signals by forming electrically insulated regions in the support member 207, and connecting the connection members 702 at these regions.

Next, a semiconductor device according to a fourth embodiment of the present invention is explained while referring to the drawings.

Figure 8:
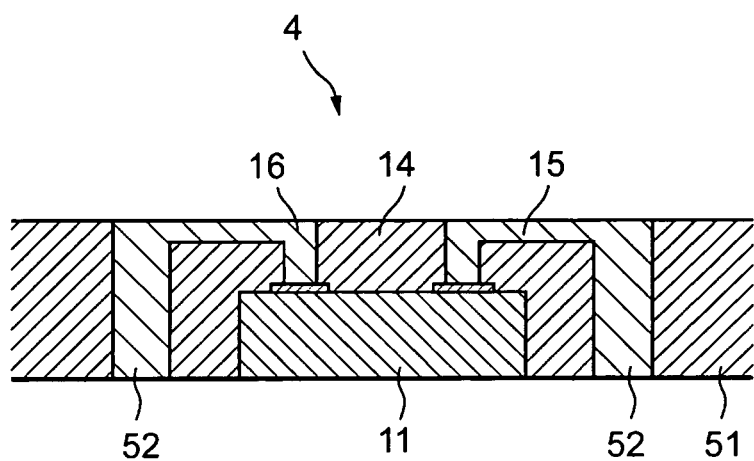
FIG. 8 is a schematic cross sectional view of a semiconductor device according to a fourth embodiment of the present invention.
Figure 9:
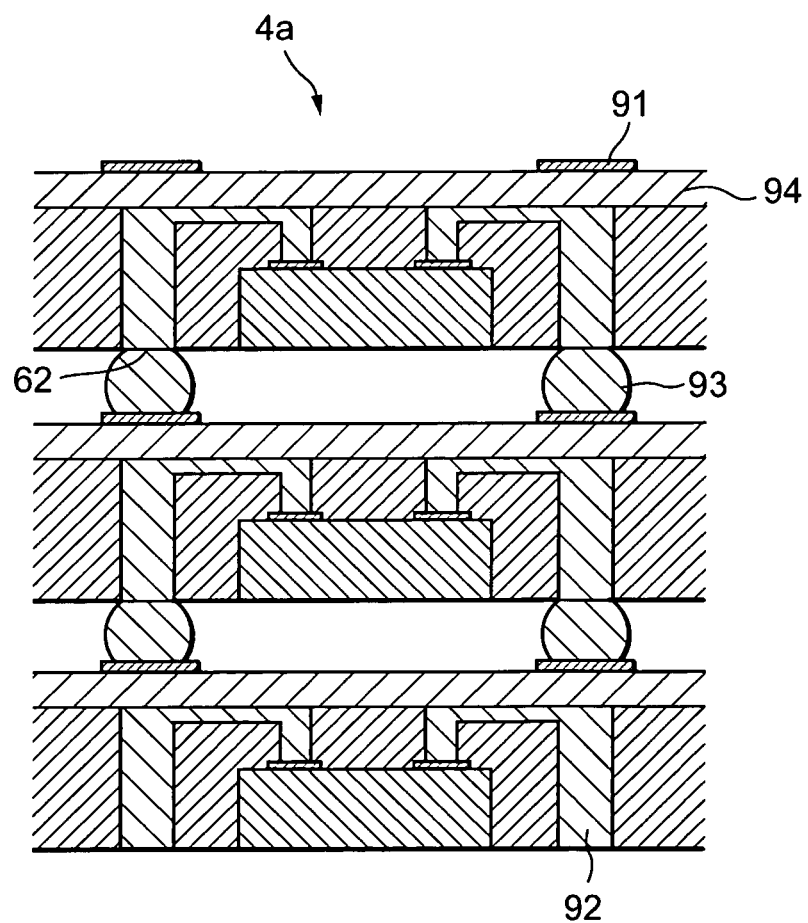
FIG. 9 is a cross sectional view that shows schematically a state in which the semiconductor device according to the fourth embodiment of the present invention are laminated in a state provided with a build-up multi-layer substrate as a circuit board.

FIG. 8 is a schematic cross sectional view of a semiconductor device according to a fourth embodiment of the present invention, and FIG. 9 is a cross sectional view that shows schematically a state in which the semiconductor device according to the fourth embodiment of the present invention are laminated in a state provided with a build-up multi-layer substrate. It should be noted that reference symbols according to FIG. 5 are attached to elements in FIG. 8 that duplicate those of FIG. 5.

A semiconductor device 4 of the fourth embodiment of the present invention is provided with a structure that is similar to that of the semiconductor device of the third embodiment. However, at least a portion of the wirings 15 that are disposed on the semiconductor chip 11 through the insulating layer 14 are embedded in the insulating layer 14. Further, the first connecting conductors 16 and the wirings 15 are substantially continuous, and have no mutual joining interfaces. In addition, the second connecting conductors 52 that are disposed filling the second through holes 51, and the wrings 15 are substantially continuous, and have no mutual joining interfaces. Increases in resistance and the development of noise in the wirings portions can be controlled by providing this structure.

In this embodiment, a step between the wirings 15 and an upper surface of the insulating layer 14, that is, a surface that is opposite to a surface that faces the semiconductor chip 11, is smaller than that in the third embodiment.

A laminate 4a of a plurality of the semiconductor devices 4 thus structured and provided with a build-up multi-layer substrate 94 like that shown in FIG. 9 is made by forming the build-up multi-layer substrate 94 on the insulating layer 14, and electrically connecting connection portions 91 that are formed on the build-up multi-layer substrate 94 and exposed end surfaces 92 of the second connecting conductors 52, through third connecting conductors 93. It should be noted that metallic bumps, for example solder bump, may be used as the third connecting conductors 93 that are used for connecting each of the semiconductor devices 4. A conductive paste may also be used.

A method of manufacturing a semiconductor device according to the fourth embodiment of the present invention is explained next while referring to the drawings.

FIGS. 10A to 10E are schematic cross sectional diagrams for explaining the method of manufacturing a semiconductor device according to the fourth embodiment of the present invention. It should be noted that reference symbols according to FIGS. 2A to 2J or to FIGS. 7A to 7G are attached to elements in FIGS. 10A to 10E that duplicate those of FIGS. 2A to 2J or of FIGS. 7A to 7G.

Figure 10C:
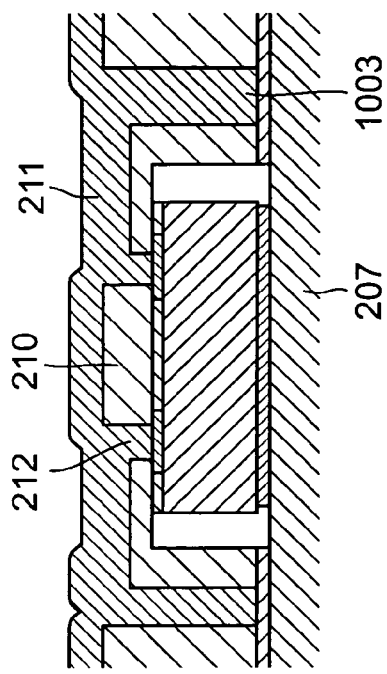
FIGS. 10A to 10E are schematic diagrams for explaining a method of manufacturing a semiconductor device according to the fourth embodiment of the present invention.
Figure 10D:
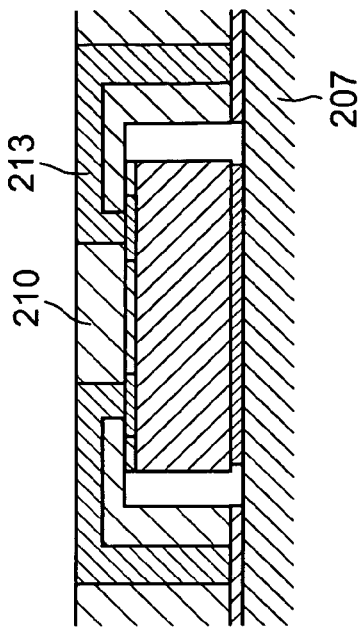
Figure 10A:
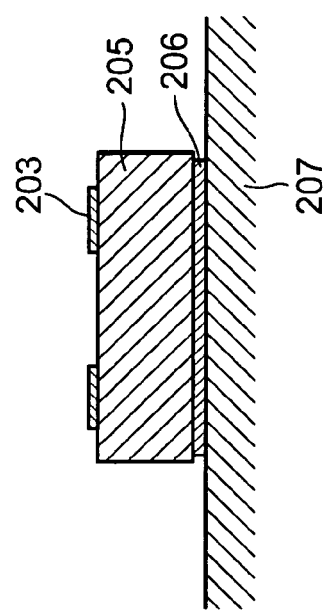

FIG. 10A shows a state where the semiconductor chip 205, which is provided with the connection pads 203, is joined to the support member 207 through the peelable adhesive 206.

Figure 10B:
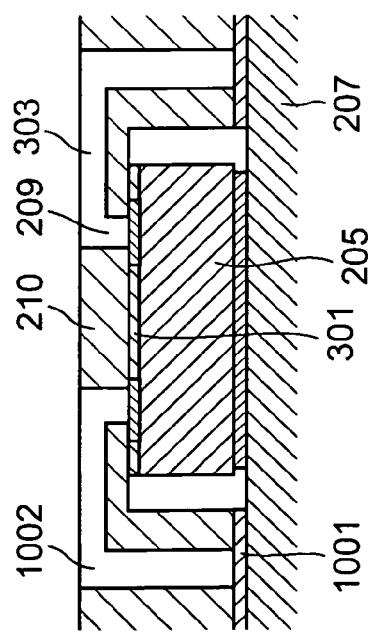

FIG. 10B shows a state where the separately made insulating layer 210 is joined to the semiconductor chip 205 through the adhesive 301, and in addition, is joined to the support member 207 through a peelable adhesive 1001.

FIG. 10C shows a state where the wiring conductive layer 211 is formed filling the wiring grooves 303 that are provided in the insulating layer 210. The connecting conductor 212 is formed in the inner portions of the first through holes 209, electrically connecting the connection pads 203 that are in the bottom surfaces of the first through holes 209 provided in the insulating layer 210, and the wiring conductive layer 211 that is formed on the surface of the insulating layer 210. In addition, an electric conductor is filled into second through holes 1002 provided in the insulating layer 210, forming connection portions 1003.

FIG. 10D shows a state where the wiring conductive layer 211 on the insulating layer 210 is polished until the insulating layer 210 is exposed, thus forming the wirings 213.

Figure 10E:
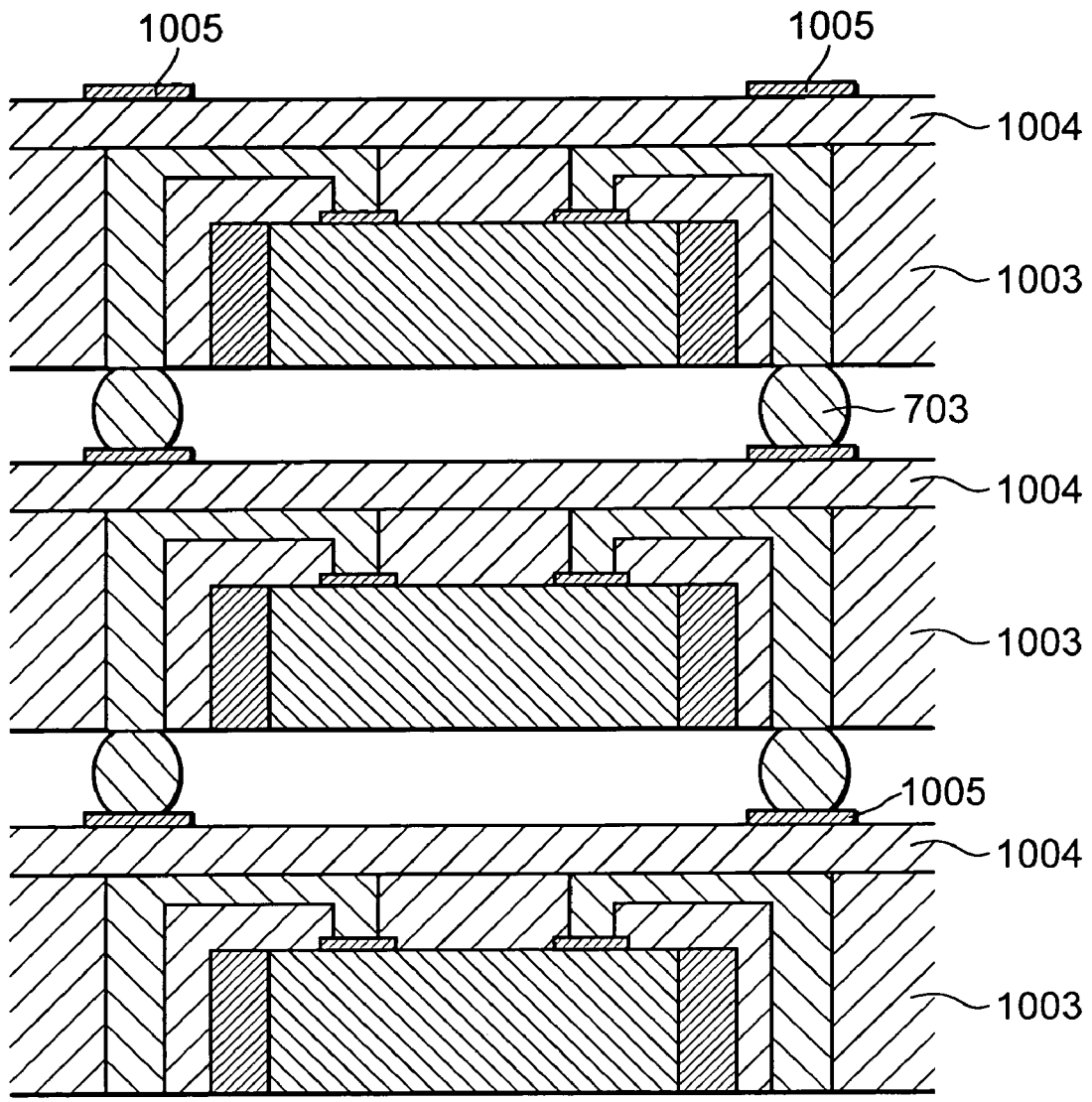

FIG. 10E shows a state where a build-up multi-layer substrate 1004 is formed on the insulating layer 210. In addition, in a plurality of semiconductor devices from which the support member 207 has been removed, the connection portions 1005 of the build-up multi-layer substrate formed on the semiconductor device are electrically connected to the exposed end surfaces of the connecting portions 1003 that are provided to another semiconductor device through connecting conductors 703.

A manufacturing method of the semiconductor device according to this embodiment is explained in detail hereinafter while referring to the drawings. It should be noted that an explanation of content that duplicates that of the second embodiment is suitably omitted from the following explanation.

First, the semiconductor chip 205 to which the connection pads 203 are provided is prepared by performing manufacturing processes similar to those of the second embodiment.

Referring to FIG. 10B, the separately made insulating layer 210 is next joined to the semiconductor chip 205 through the adhesive 301, and in addition, is joined to the support member 207 through the peelable adhesive 1001. It is preferable that the same material as that used in the peelable adhesive 206 employed in joining the semiconductor chip 205 and the support member 207 be used as the adhesive 1001. This is because it is possible to perform peeling by the same process.

The insulating layer 210 has a concave portion capable of encapsulating the semiconductor 205. The first through holes 209 are formed in a bottom surface of the concave portion. The second through holes 1002 are formed in the frame which form the opening of the concave portion. Further, the wiring grooves 303 are provided in a surface that is opposite to the bottom surface of the concave portion. The insulating layer 210 is disposed in a state where the bottom surface of the concave portion faces the surface of the semiconductor chip 205 on which connection pads 203 are formed.

A method of forming the second through holes 1002 is performed similar to that used for forming the first through holes 209. Preferably the same processing method is performed. For example, for cases where the first through holes 209 are formed by molding, the second through holes 1002 are also formed by the same molding process. This is because the manufacturing efficiency increases, and the process precision increases.

Referring to FIG. 10C, the wiring conductive layer 211 is then formed filling the wiring grooves 303 that are provided in the insulating layer 210. In addition, the first through holes 209 and the second through holes 1002 are filled at the same time with this embodiment by the process of forming the wiring conductive layer 211. That is, in this embodiment the wiring conductive layer 211, the connecting conductors 212, and the connecting portions 1003 are formed by using the same material. Joining interfaces between the wiring conductive layer 211 and the connecting conductors 212, and joining interfaces between the wiring conductive layer 211 and the connecting portions 1003 are therefore not formed. Specifically, the wiring conductive layer 211, the connecting conductors 212, and the connecting portions 1003 are formed by using electroplating with the method of manufacturing a semiconductor device according to this embodiment.

The wiring conductive layer 211 on the insulating layer 210 is partially removed next, thus ensuring that short circuits between adjacent wiring conductive layers 211 that fill the wiring grooves 303 do not develop. It is preferable to use a leveling, polishing process such as CMP as the removing method. As a result, the wirings 213, at least a portion thereof being embedded, are formed in the substantially flat surface that is formed by processing the insulating layer 210, as shown in FIG. 10D.

It is preferable that steps between the exposed surface of the insulating layer 210 and the wirings 213 be equal to or less than 10 µm in height at this point. This is because there is a possibility that the build-up multi-layer substrate will be formed directly contacting the insulating layer 210 in this embodiment, and the likelihood that wire breakage will occur in wirings within the build-up multi-layer substrate increases for cases where the step is greater than 10 µm.

The build-up multi-layer substrate is then disposed on the insulating layer 210. Referring to FIG. 10E, the build-up multi-layer substrate 1004 may be formed directly on the insulating layer 210. A separately formed build-up multi-layer substrate may also be joined by using a suitable connecting material, for example solder bumps or a conductive paste.

The support member 207 is then removed by a manufacturing method that is similar to the manufacturing methods employed in the other embodiments described above. By laminating a plurality of the semiconductor devices so that the connecting portions 1005 formed on the build-up multi-layer substrate are electrically connected to the exposed end surfaces of the connecting portions 1003 that are provided in the other semiconductor devices, through the connecting conductors 703, a laminate of the semiconductor devices that are provided with the build-up multi-layer substrates is thus formed as shown in FIG. 10E. It should be noted that metallic bumps, for example solder bump, or a conductive paste may be employed as the connecting conductors that are used in making mutual connections between the semiconductor devices.

It should be noted that, although the support member 207 is removed in this embodiment, the support member 207 need not be removed, and may instead be used as a heat radiating disc of the semiconductor chip 205, for example. In this case, a conventionally used heat resistant adhesive made from an epoxy resin or the like may be used as a substitute for the peelable adhesive 206 that is employed between the semiconductor chip 205 and the support member 207. Further, for cases in which a conductor is used in the support member 207, a conductive adhesive may be used between the connectors 1003 and the support member 207 as a substitute for the peelable adhesive 206. In addition, it becomes possible to use the connectors 1003 as wirings for a plurality of types of signals by forming electrically insulated regions in the support member 207, and connecting the connectors 1003 at these regions.

Furthermore, the semiconductor device according to the third embodiment may also be manufactured by using the manufacturing method of this embodiment. In this case the insulating layer 210 is not provided with the wiring grooves 303. After forming the wiring conductive layer 211, the wiring conductive layer 211 is then partially removed by using the conventional technique of photofabrication. The wirings 213 are thus formed.

It is apparent that the present invention is not limited to the above embodiments, but may be modified and changed without departing from the scope and spirit of the invention.

What is claimed is:

1. A method for manufacturing a semiconductor device, comprising:
    forming a first resist post on a connection pad of a semiconductor chip;
    forming a second resist post on a support member;
    mounting the semiconductor chip on the support member apart from the second resist post;
    forming an insulating layer that covers the semiconductor chip, the first resist post, and the second resist post;
    removing the insulating layer to expose a surface of the first resist post and a surface of the second resist post;
    removing the first resist post and the second resist post to form a first through hole and a second through hole in the insulating layer, the first through hole thereby exposing the connection pad, and the second through hole thereby exposing the support member;
    forming a wiring layer that is in electrical contact with the connection pad via the first through hole and is in contact with the support member via the second through hole and is elongated over the insulating layer; and
    removing at least a part of the support member to expose the wiring layer as a rear pad in a surface of the insulating layer opposite to a surface in which the first through hole is formed.

2. The method according to claim 1, wherein the wiring layer is formed by plating.

3. The method according to claim 1, further comprising:
    preparing a plurality of the semiconductor devices;
    connecting the rear pad of one of the semiconductor devices to the wiring layer of another semiconductor device electrically to laminate the plurality of the semiconductor devices.

4. The method according to claim 3, wherein the rear pad of one of the semiconductor devices and the wiring layer of another semiconductor device are connected via a solder bump or a conductive paste.

5. The method according to claim 1, further comprising:
    preparing a plurality of the semiconductor devices;
    forming a build-up multi-layer substrate on the wiring layer of each of the semiconductor devices, the build-up multi-layer substrate having a connection portion on a surface opposite to a surface facing the wiring layer;
    connecting the rear pad of one of the semiconductor devices to the connection portion of the build-up multi-layer substrate formed on another semiconductor device electrically to laminate the plurality of the semiconductor devices.

* * * * *